United States Patent [19]

Essenberg

[11] Patent Number: 5,759,002
[45] Date of Patent: Jun. 2, 1998

[54] ATTACHMENT DEVICE FOR A COVER PLATE

[75] Inventor: J. A. Corrie Essenberg, Huddinge, Sweden

[73] Assignee: Telefoanktiebolaget LM Ericsson, Stockholm, Sweden

[21] Appl. No.: 682,757

[22] PCT Filed: Feb. 23, 1995

[86] PCT No.: PCT/SE95/00192

§ 371 Date: Jul. 31, 1996

§ 102(e) Date: Jul. 31, 1996

[87] PCT Pub. No.: WO95/23294

PCT Pub. Date: Aug. 31, 1995

[30] Foreign Application Priority Data

Feb. 25, 1994 [SE] Sweden ............ 9400661

[51] Int. Cl.⁶ ............ F16B 13/06; A44B 1/04
[52] U.S. Cl. ............ 411/45; 411/41; 411/60; 24/297
[58] Field of Search ............ 411/41, 45, 46, 411/48, 57, 60, 61; 24/297, 453

[56] References Cited

U.S. PATENT DOCUMENTS

| | | | |
|---|---|---|---|
| 2,657,894 | 11/1953 | Sklenar | 411/41 X |
| 3,203,304 | 8/1965 | Rapata | 411/41 |
| 3,595,506 | 7/1971 | Saunders | 411/48 X |
| 4,715,095 | 12/1987 | Takahashi | 24/297 X |
| 5,322,402 | 6/1994 | Inoue | 411/41 X |
| 5,540,528 | 7/1996 | Schmidt et al. | 411/41 |

FOREIGN PATENT DOCUMENTS

| | | | |
|---|---|---|---|
| 4111374 | 10/1991 | Germany. | |
| 423832 | 6/1982 | Sweden. | |
| 466023 | 12/1991 | Sweden. | |
| 418735 | 2/1967 | Switzerland | 24/297 |
| 1036423 | 7/1966 | United Kingdom. | |

*Primary Examiner*—Neill R. Wilson
*Attorney, Agent, or Firm*—Burns, Doane, Swecker & Mathis, L.L.P.

[57] ABSTRACT

A plastic fastener for securely and reliably fastening a cover plate to a rack cabinet includes a fastener part and a pin. The fastener part has a pierced shaft which includes tabs or similar appendages and two spaced flange-like collars. The fastener part is inserted in a hole in a rack cabinet and the pin is then inserted in the pierced shaft of the fastener part, which forces the tabs to spread outward from the fastener part to fix the fastener part in the hole. The cover plate is then pushed between the two flange-like collars.

9 Claims, 5 Drawing Sheets

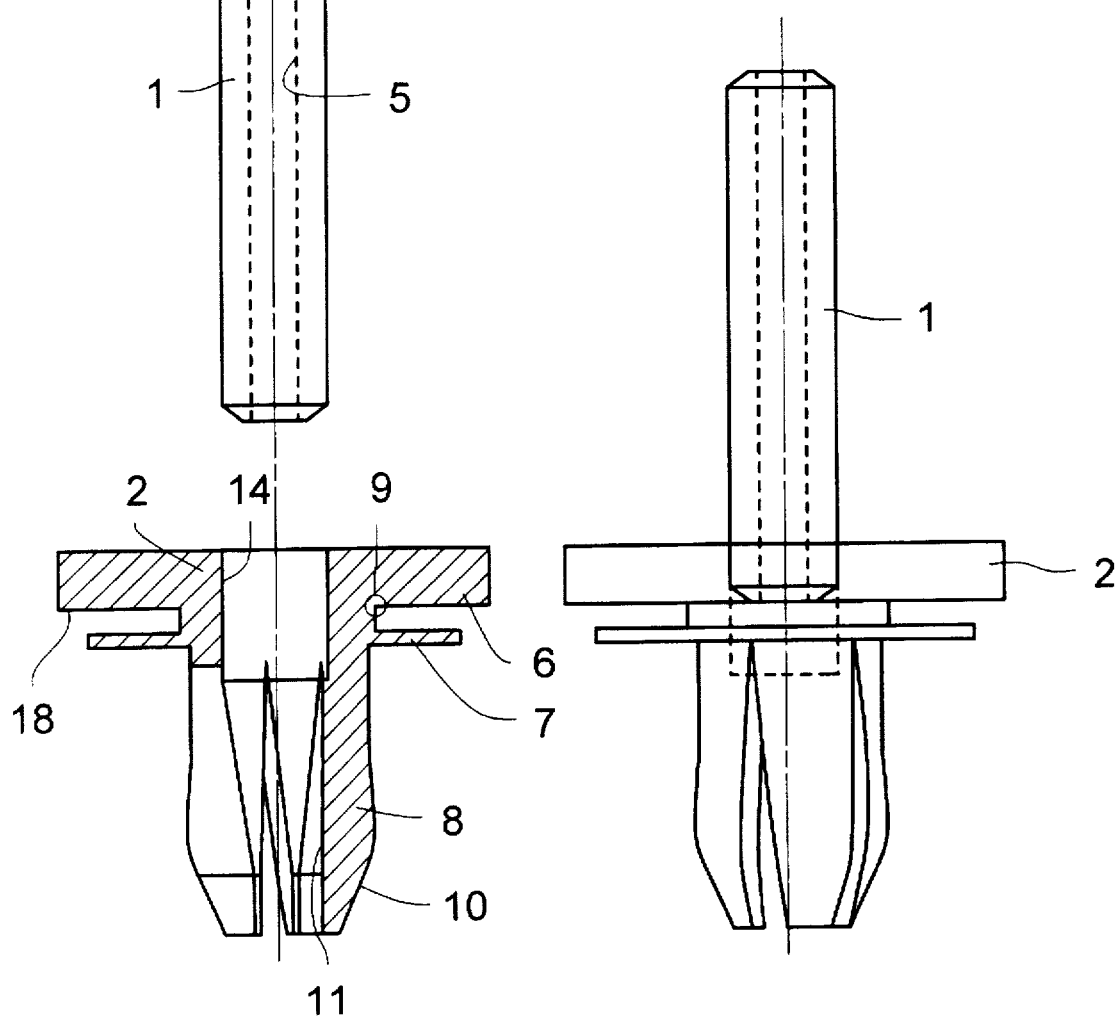

ATTACHMENT DEVICE FOR A COVER PLATE

The present invention relates to a fastener device for securing a cover plate or like element, said fastener device including a hole-mounted first fastener part which includes a cover plate supporting surface, and a second fastener part which interacts with said first fastener part and functions to fix and secure the first part in said hole, such as to provide a fastening for a cover plate or like element.

Fastener devices which consist in two interacting parts are previously known from DE-A 4,111,374 and SE-B 423,832. These known fastener devices include a first fastener part having a flange and a through-pierced portion for insertion into a hole, and a second fastener part which is configured for insertion into said through-piercing hole, wherein the insertable portion of the first fastener part is deformed as the second fastener part is inserted therein, so as to be able to secure a plate or like element.

SUMMARY OF THE INVENTION

For the purpose of readily securing a cover plate to a rack cabinet for, e.g., telecommunications equipment, such as to obtain reliable and secure fastening of the plate, there is provided a plastic fastener device which consists in two interacting parts, i.e. a fastener part and a pin. The fastener part is comprised of a pierced shaft portion and two connected flanged collars. The pin, which may be provided with a through-penetrating hole, is intended to be driven into the pierced shaft portion and therewith deform the same. The shaft portion includes conical tabs or like appendages which when the shaft portion is inserted into a hole on a rack cabinet and the pin is driven into the through-pierced shaft portion are deformed such as to affix and secure the collared shaft portion in said hole. The cover plate can now be pushed onto the fastener device, between the two collar flanges.

The firmness with which the plate is secured and the ease with which the plate can be removed is determined by the distance between the collars and the thickness and shape of the plate.

BRIEF DESCRIPTION OF THE DRAWINGS

FIG. 2a illustrates an end view the pin of the fastener device shown in FIG. 1.

FIG. 2b is a side view of the pin of FIG. 2a.

FIG. 3 is a sectioned view of the fastener part of the device shown in FIG. 1.

FIG. 4 shows the pin partially inserted into the fastener part in FIG. 3.

FIG. 7 shows the fastener part inserted in a hole on one part of a rack cabinet, and also shows an associated pin ready for insertion.

FIG. 8a shows a front view of a cover plate.

FIG. 8b shows a side view of the cover plate of FIG. 8a.

DETAILED DESCRIPTION OF THE INVENTION

Figure 1:
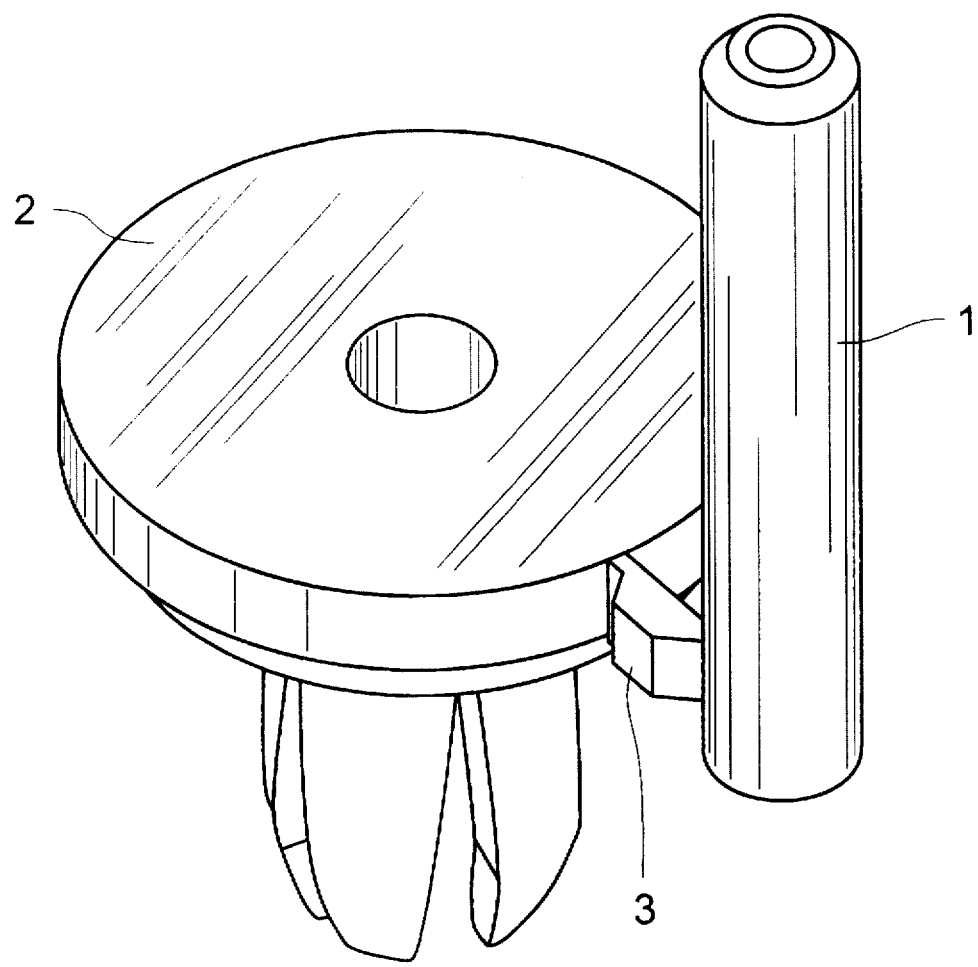
FIG. 1 illustrates an inventive fastener device comprising an fastener part and a pin, and shows the device as a one-piece moulded article.
Figure 5A:
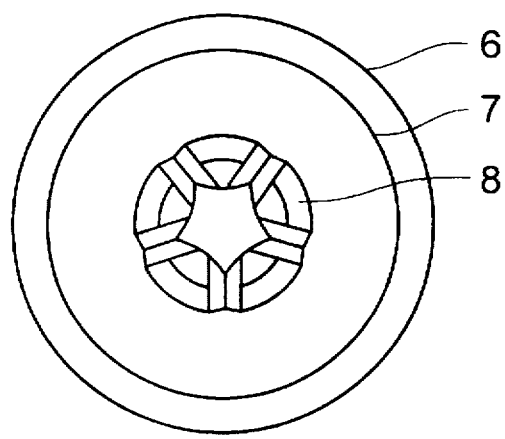
FIG. 5a is a bottom end view, of the fastener part in FIG. 1.
Figure 5B:
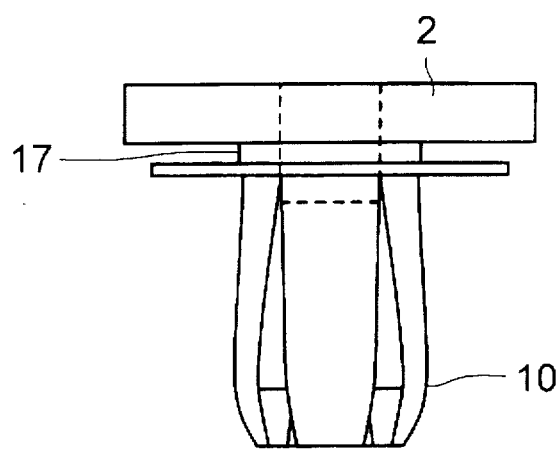
FIG. 5b is a side view of the fastener part showing a tab in full view.
Figure 5D:
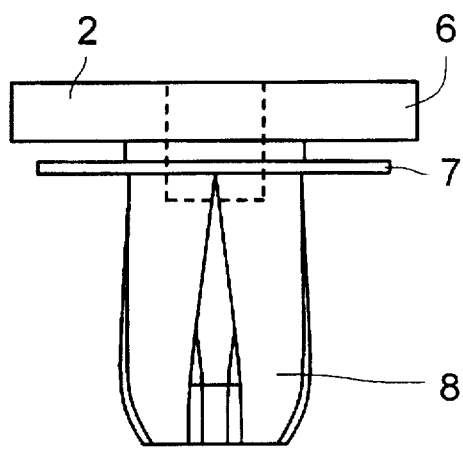
FIG. 5d is a side view of the fastener part rotated about the longitudinal axis to show a gap between adjacent tabs.
Figure 5C:
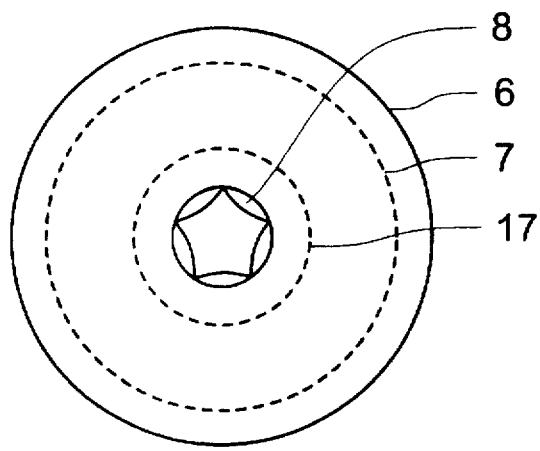
FIG. 5c is a top end view of the fastener part.

FIG. 1 illustrates an inventive fastener device, which in the illustrated case is delivered in the form of a one-piece plastic moulded product, with the pin 1 and the fastener part 2 joined together by a moulding part 3. As shown at 4 in FIG. 2, the pin is bevelled at both ends and includes a through-penetrating hole 5, partially for reasons of a moulding/technical nature. FIG. 3 is a sectional view of the fastener part 2, which will be seen to include two flange-like collars 6, 7 and tabs or like appendages 8. The upper collar 6 is thicker than the lower collar 7 and includes a supportive surface 18. The thickness of the upper collar is determined partially to be able to withstand external forces, for instance to prevent the junction 9 between collar and shaft breaking should the pin be positioned obliquely (see FIG. 4) when being inserted into the fastener part, and such that the resistance afforded by the collar will assist in achieving correct alignment of the pin with a favourable force distribution from the collar to the shaft part carrying the tabs.

The illustrated shaft includes five tabs. An odd number of tabs provides a better holding force than an even number of tabs, should the direction of an aperture or recess 15 in a cover plate 16 fail to coincide with two diametrically opposed tab interspaces. The width of the recess or aperture 15 is adapted generally to accommodate the diameter 17 of the fastener part 2 between the collars 6 and 7. Each tab 8 has a slightly curved outer side 10 and a slightly conical and inwardly directed inner side 11, such that as the pin is inserted into the region of the inwardly directed inner sides, the tabs will be forced elastically outwards, and the pin is held in place subsequent to being inserted. The fastener device is preferably made of a carbonate plastic, so as to have an acceptable impact resistance and so that the device will have an elasticity acceptable for its function.

Figure 6:
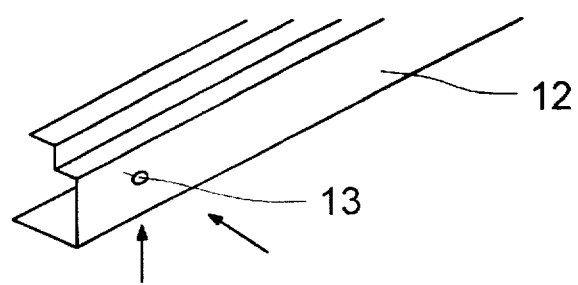
FIG. 6 is a simplified illustration of part of a rack cabinet.
Figures 7, 8A, 8B:
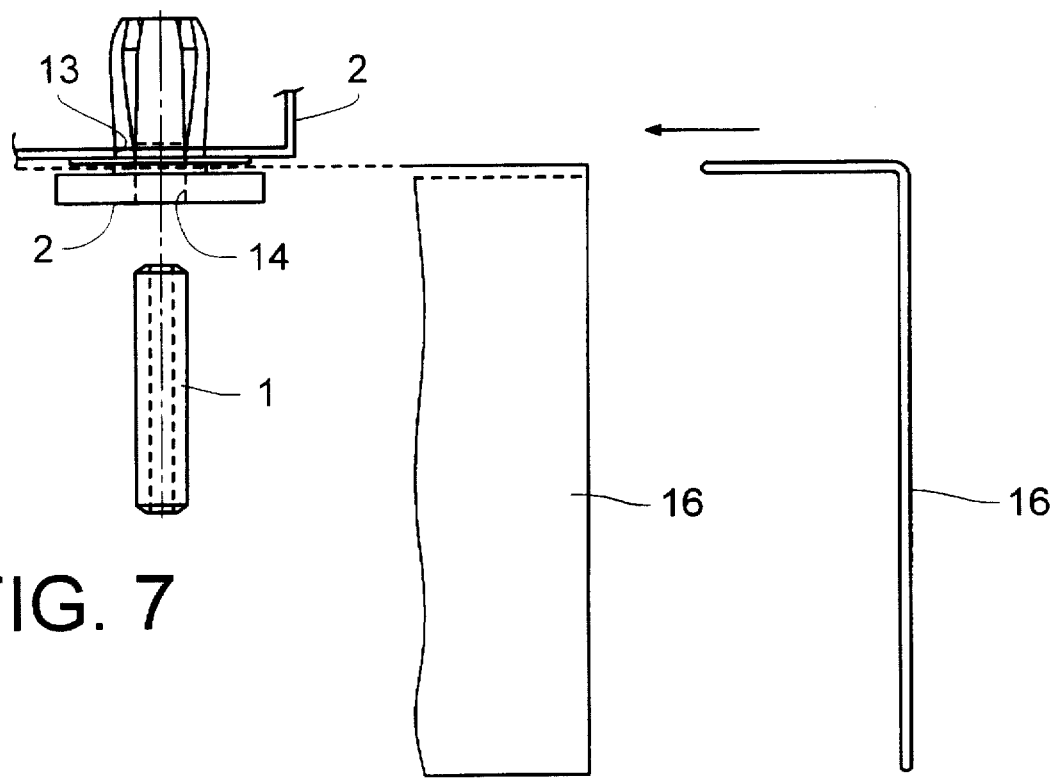
Figure 9:
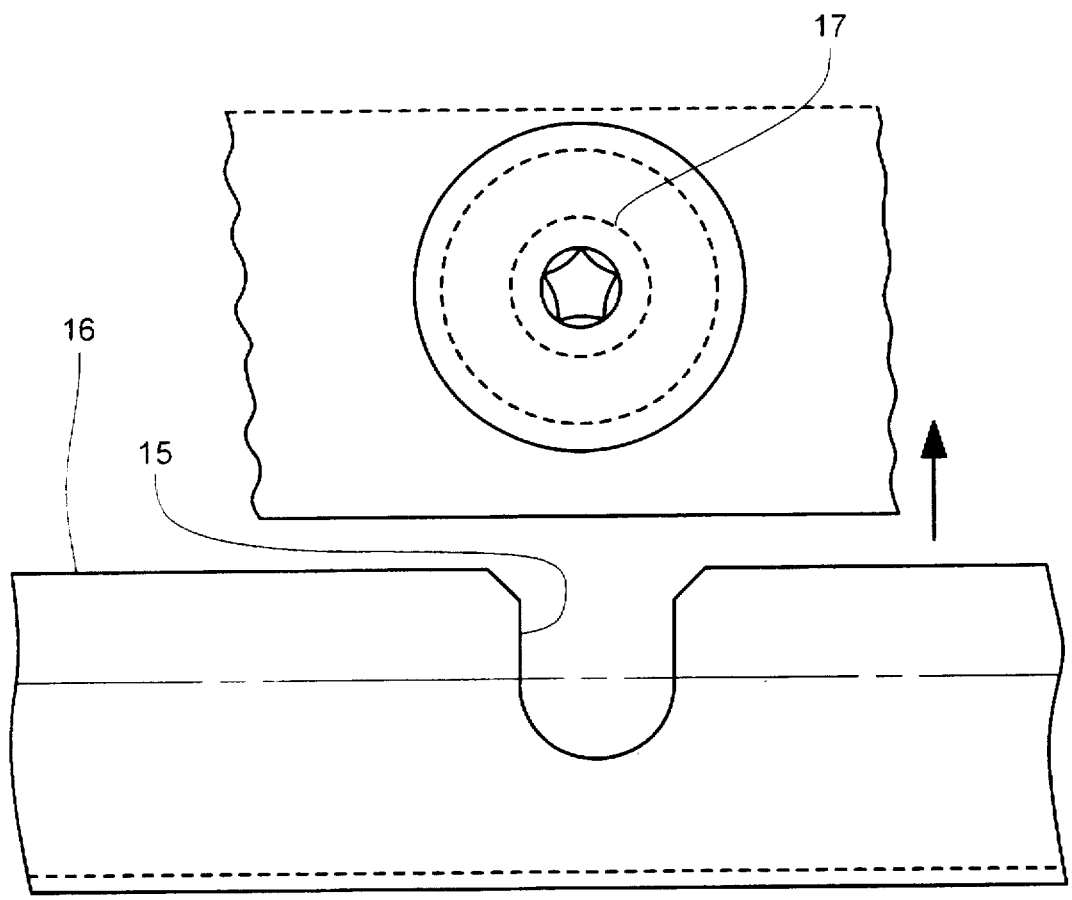
FIG. 9 shows the cover plate and the fastener device from above.

FIG. 6 is a greatly simplified view of the lower part of a rack cabinet 12. The cabinet 12 includes a profiled section having on the underside thereof a transversely extending plate which includes one or more holes 13 into which the fastener part of a respective fastener device shall be inserted. FIG. 7 shows a fastener part 2 inserted into a hole 13 in a plate element from beneath. The outwardly slightly curved tabs with their bevelled ends can easily be pressed together for insertion into the hole, whereafter the tabs spring back to their original form and hold the fastener part in the hole in said plate and loosely secure the fastener part in said hole. With the fastener part in position in the hole and with the collar 7 resting against a surface around the hole 13 in the plate element 12, the pin 1 is driven up into the downwardly facing hole 14 in the fastener part, the diameter of said hole being of a size which will enable the pin to be readily inserted over the first few millimeters with the application of a small force. When the pin has passed the region of the thinner collar 7, the pin will meet a further region which is delimited by the five tabs 8, which when no load is applied thereon decrease in a direction towards the centre axis of the fastener part, i.e. the inner surfaces of the tabs are slightly conical towards said centre axis. Further insertion of the pin from said region will cause the tabs to be forced out elastically against the resistance offered by the edge of the plate acting against the inner and thinner collar, and the fastener device is held firmly in the hole at the junction between the thinner collar and the tabs or like appendages. With the pin fully inserted in the fastener part, there is obtained a reliable and positive attachment of the fastener part and the fastener device will function effectively to support a cover plate on the supportive surface 18 on the collar 6.

What is claimed is:

1. A fastener device for securing a plate to a support element, comprising:

a fastener part having a shaft with a hole extending longitudinally therethrough, the fastener part having first and second flange-shaped collars extending radially from an upper portion of the shaft, the collars longitudinally spaced on the shaft, a surface of the first collar facing the second collar forming a supporting surface for receiving and supporting a plate inserted between the two collars, a lower portion of the shaft insertable in an aperture in a supporting element; and a pin insertable in the hole in the shaft, the pin having an outer diameter greater than a diameter of the hole in the lower portion of the shaft so that the pin elastically deforms the lower portion of the shaft to secure the shaft in the aperture in the supporting member.

2. A fastener device according to claim 1, wherein the first collar is thicker than the second collar.

3. A fastener device according to claim 1, wherein the lower portion of the shaft is formed as an odd number plurality of longitudinally extending tabs.

4. A fastener device according to claim 3, wherein in the absence of deforming forces, inner surfaces of the tabs defining the hole converge in the longitudinal direction towards a central axis of the hole.

5. A fastener device according to claim 3, wherein outer surfaces of the tabs are bevelled.

6. A fastener device according to claim 3, the first collar has a thickness in the longitudinal direction that is substantially the same as a length of a shaft portion between the first collar and the tabs.

7. A fastener device as claimed in claim 3, wherein the lower portion of the shaft comprises five tabs.

8. A fastener device according to claim 1, wherein the fastener device is made of a plastic material.

9. A fastener device according to claim 8, wherein the plastic is a carbonate type plastic.

* * * * *